US005278574A

United States Patent [19]

Zimmerman et al.

[11] Patent Number: 5,278,574

[45] Date of Patent: Jan. 11, 1994

[54] MOUNTING STRUCTURE FOR MULTI-ELEMENT PHASED ARRAY ANTENNA

[75] Inventors: Kurt A. Zimmerman, Atlanta; Thomas E. Bell, Roswell, both of Ga.

[73] Assignee: Electromagnetic Sciences, Inc., Atlanta, Ga.

[21] Appl. No.: 693,938

[22] Filed: Apr. 29, 1991

[51] Int. Cl.[5] ........................ H01Q 23/00; H01Q 3/36; H05K 7/00

[52] U.S. Cl. .................................... 343/778; 343/853; 333/245; 361/707

[58] Field of Search ............... 343/778, 777, 853, 754, 343/757; 333/245; 361/386-388

[56] References Cited

U.S. PATENT DOCUMENTS

| | | | |
|---|---|---|---|
| 3,274,601 | 9/1966 | Blass | 343/778 X |
| 3,631,501 | 12/1971 | Buscher | 343/754 |
| 4,001,834 | 1/1977 | Smith | 343/754 |
| 4,044,360 | 8/1977 | Wolfson et al. | 343/778 X |
| 4,700,273 | 10/1987 | Kaufman | 361/388 |
| 5,075,648 | 12/1991 | Roberts et al. | 333/128 |

OTHER PUBLICATIONS

Article by Howard Mansell, "Hybrid Metal Packages By Explosion Bonding" *Hybrid Circuit Technology*, Sep., 1990, pp. 67-69.

Promotional Literature of Lockhart Industries, Inc., Paramount, Calif. for VACU-CELL, drawings dated Jul., 1990, 22 pages.

*Primary Examiner*—Benny T. Lee

*Attorney, Agent, or Firm*—Jones & Askew

[57] ABSTRACT

A low cost, light weight, high performance phase shifter mounting structure which allows high density packaging of phase control modules for phased array antennas. The mounting structure is a bimetallic sandwich design in the shape of an I-beam having a top flange for mating to radiating elements, a bottom flange for mating to a feed network, and a center web for mounting phase control modules. The I-beam is formed from a single piece of laminated stock comprising an outer layer of aluminum and a core layer of titanium forming an anisotropic thermal expansion composite material. The titanium center web matches the coefficient of thermal expansion of the typical ferrite, MIC, or MMIC phase shifter and driver circuits. The aluminum flange material allows easy machining of microwave transitions at each end of the I-beam and matches the expansion of typical radiating element structure and feed networks. The structure provides improved reliability when the subarray is subjected to repeated and widely ranging thermal cycling.

59 Claims, 4 Drawing Sheets

FIG 1A
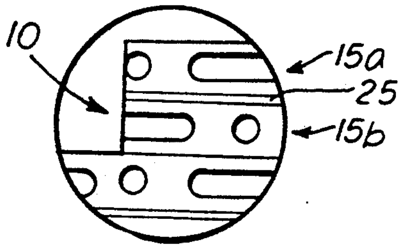
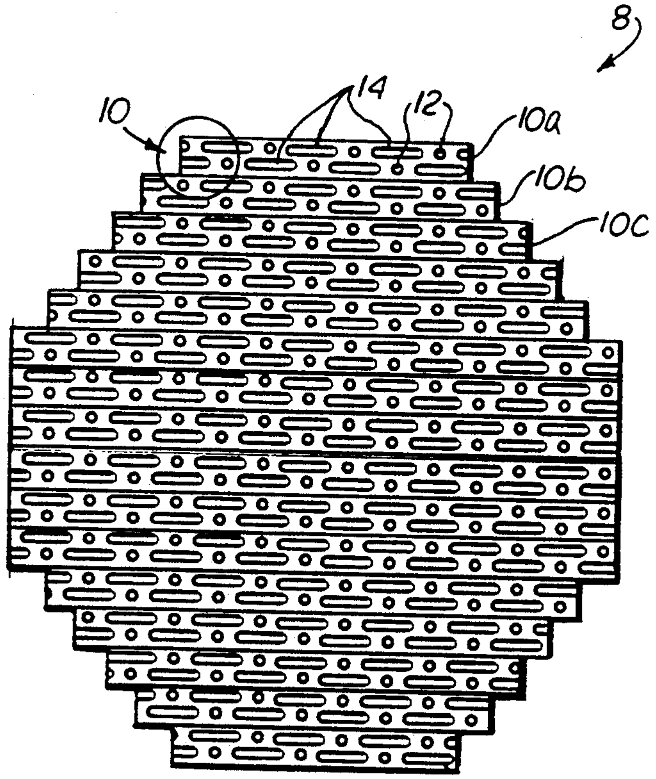
FIG 1

MOUNTING STRUCTURE FOR MULTI-ELEMENT PHASED ARRAY ANTENNA

TECHNICAL FIELD

The present invention relates generally to phased array antennas, and more particularly relates to a composite laminate mounting structure for phase shifters, driver circuits, waveguide feed networks, and radiating structures in a planar phased array antenna.

BACKGROUND

Planar phased array antennas are known in the art, and are often used in radar and RF communications applications. Such antennas typically comprise a plurality of radiating structures arranged in a planar array, operative to emit electromagnetic energy at RF frequencies, phased so as to form an electronically steerable beam.

Phased array antennas require phase shifting networks or circuits to effect the phase shifting for each radiating structure. Typical phased array antennas include a waveguide or microstrip transmission line signal feed network affixed to one side of a mounting structure associated with a phase shifting subassembly. The feed network directs incoming RF energy into the phase shifting subassembly, where individual phase-shifting elements are provided for each of the plurality of radiating structures. The phase shifting subassembly typically includes a plurality of phase shifting devices which impose a predetermined amount of phase shift upon a signal in accordance with a control signal originating in a control source typically external to the antenna. The radiating structures, such as horns, notch elements, or waveguide elements, are physically affixed to the opposite side of the mounting structure, and are operative to receive the phase-shifted energy from the phase shifting subassembly and emit same outwardly of the plane of the phased array antenna.

Mounting structures for conventional phase shifter subassemblies have been constructed of aluminum for light weight, low cost, and ease of fabrication. The phase shifters themselves are typically ferrite waveguide devices or MIC/MMIC (microwave integrated circuit or monolithic microwave integrated circuit) devices on ceramic substrates.

Difficulties have been encountered in the mounting of phase shifters on conventional mounting structures, in that the ferrite or ceramic with which the phase shifters are constructed has a different coefficient of thermal expansion than the aluminum mounting structure to which the phase shifters are mounted. The mismatch in thermal expansion coefficients between the phase shifters and the mounting structure causes performance degradation and eventual physical failure as a result of thermal cycling. Difficulties due to thermal cycling are especially pronounced in phased array antennas deployed in avionics bays of aircraft, which can experience substantial temperature changes in a short period of time.

Several classes of structural materials are available which have coefficients of thermal expansion closely matched to ferrites and ceramics. Some of the more common materials include titanium, KOVAR® metal alloy (manufactured by Carpenter Technology Group, Reading, Pa.), INCONELO nickel alloy (manufactured by International Nickel Co. Inc., New York, N.Y.), metal matrix aluminums, and specially doped plastics. However, none of these materials possess a satisfactory combination of the desirable properties of aluminum such as light weight, low material cost, ease of machinability, corrosion resistance, high thermal conductivity, and high electrical conductivity.

Accordingly, there is a need for an improved non-flat mounting structure for phase shifters, amplifiers, and electronic circuits that is reliable, low cost, and easy to fabricate.

SUMMARY OF THE INVENTION

Briefly described, the present invention provides an improved mounting structure for mounting a plurality of radiating structures, phase shifters, driver circuits, and a waveguide feed network. The preferred embodiment is fabricated of a bimetallic laminated or clad stock or billet. The stock or billet is a three-layer sandwich construction with outer skins of aluminum and an inner ply of titanium. This bimetallic sandwich maintains the beneficial aspects of an-all aluminum subarray mounting structure. The input microwave transition section can be machined entirely in aluminum as well as the output microwave transition section. The input and output microwave structures in aluminum will match the thermal expansion of the radiating element structure and feed structure which are primarily aluminum or copper. The center web or core material thickness is chosen prior to lamination and requires only clearance holes and slots to be added. The initial bimetallic sandwich stock is easily fabricated by laminating both sides of web material (having coefficients of thermal expansion matched to the phase shifters) with aluminum bars via alignment tooling and adhesive in a heat press. In addition to adhesives, alternate methods of attachment can be utilized, including mechanical fastening, brazing, and intermolecular attachment.

The invention allows for incorporation of three-dimensional mounting interfaces or geometry directly, into the composite billet. As a mounting structure for components or subsystems, the invention will find application in a broad arena of electronic and antenna applications including, but not limited to linear and planar phased arrays, switch matrixes, filter banks, and distributed amplifiers.

More particularly described, the improved mounting structure comprises a bimetallic sandwich or clad stock material mounting subarray having oppositely disposed outer flanges and a center web for mounting phase shifter circuits. The center web has a coefficient of thermal expansion substantially matched to the coefficient of thermal expansion of the phase shifter circuits. The outer flanges have thermal expansion characteristics substantially matched to the thermal expansion characteristics of the radiating structures and the feed network, which are mounted thereto. The subarray is a laminated bimetallic sandwich or clad stock structure fabricated from alternating layers of aluminum, a bonding means or agent, and titanium. The bonding means or agent can be accomplished using an adhesive, brazing, or intermolecular attachment. The laminated structure may also be subjected to heat and pressure curing.

Still more particularly described, a mounting structure constructed according to the present invention is a two-row subarray mounting structure suitable for assembly with a plurality of like subarrays to form an assembled phased array antenna. Means for mounting a plurality of radiating structures are provided on a top edge or flange of the subarray, with the radiating structures being positioned to radiate electromagnetic energy outwardly of the web when a plurality of subarrays are assembled into a completed phase array antenna. Means for mounting a waveguide feed network are provided on the opposite or bottom edge or flange of the subarray, for directing RF energy to prior to phase shifting into the active elements of the subarray.

A titanium web for mounting a plurality of phase shifters is provided in between the outer flanges of the subarray mounting structure. Thus, the top flange and the bottom flange of the subarray are spaced apart by the web. The web is fabricated from a material having a thermal coefficient of expansion matched with the coefficient of thermal expansion of the phase shifter circuits. With the phase shifters mounted to the web, and the feed network and radiating structure physically mounted to the outer flanges of the subarray structure, the various components are mounted in juxtaposition to a mounting structure having matched thermal characteristics.

Yet still more particularly described, the preferred subarray mounting structure comprises an elongate I-beam having spaced-apart and opposing widened flanges. The widened flanges provide means for mounting radiating structures for the antenna and for mounting a waveguide feed network. Each I-beam accommodates two rows of radiating structures and associated feed network, and thus forms a two-row subarray. A plurality of I-beam subarrays are assembled in varying lengths in parallel alignment to form a complete planar phased array antenna.

The outer portions or flanges of the I-beam are formed of aluminum. The outer flanges are machined to form openings for receiving RF energy from the waveguide feed network, directing the energy into the active phase shifters mounted inside the I-beam between the flanges of the I-beam, and guiding the phase-shifted energy outwardly to the radiating structures.

A center web portion extends between the outer flanges of the I-beam and provides a region for mounting phase shifters and driver circuits. A plurality of phase shifter hybrid circuits are affixed to the center portion of web.

The preferred I-beam subarray itself comprises a bimetallic sandwich or clad laminated structure formed of alternating layers of aluminum, adhesive, titanium, adhesive, and aluminum. The outer flanges are predominantly aluminum, separated by the thickness of the center web portion, with the web being titanium. The materials of aluminum, adhesive and titanium are formed into a unitary structure by applying heat and pressure to the materials after the application of adhesive. Thus, the entire I-beam comprises a unitary "sandwich"-like structure. The bimetallic sandwich or clad structure is formed prior to machining openings for waveguides and mounting holes.

Thus, the waveguide feed network and radiating structures, typically made from aluminum and mounted to the outer flanges of the I-beam, are thermally matched to the subarray.

Likewise, the ferrite phase shifters, mounted to the center web, are also thermally matched to the subarray. The preferred bimetallic sandwich or clad structure has been found to exhibit a desirable anisotropic thermal expansion—matching the phase shifter circuits in the width direction and matching the feed and radiating structures in the other direction. This result was achieved with only a nominal cost increase over an all-aluminum design and without the considerable expense of custom tailoring, at the "powder" level, a new generation of materials. In the material sciences, the tailoring of a new generation of materials at the "powder" level essentially means, to those skilled in the art, the formulation of new composite materials in powder form, typically plastics and metals. These materials are often initially formulated as powders or pellets, and are processed in various ways, typically involving application of heat and possibly pressure, to form a homogeneous metallic alloy substance. Such materials usually exhibit unique characteristics, and are usually expensive and difficult to form or otherwise fabricate with conventional machining equipment. Thus, when the phase shifters are affixed to the center web, the structure of the phase shifters will exhibit thermal expansion and contraction characteristics substantially the same as that of the center web when the entire assembly is subjected to heating and cooling during thermal cycling.

OBJECTS OF THE INVENTION

Accordingly, it is an object of the present invention to provide an improved mounting structure for any type of phase shifter or phased array module which has structural coefficients of thermal expansion different than aluminum.

It is another object of the present invention to provide a mounting structure for phase shifting elements of a phased array antenna which is low cost, light weight, and easy to fabricate.

It is another object of the present invention to provide an improved mounting structure for elements of a phase array antenna which is matched to the thermal characteristics of the radiating structures, the waveguide feed network, and the phase shift components, where such components and elements possess different coefficients of thermal expansion.

It is another object of the present invention to provide an improved mounting structure for elements of a phased array antenna, which includes a web for reliably mounting a plurality of phase shifter modules or circuits without causing performance degradation or part failure due to thermal expansion stresses caused by mounting to a homogenous aluminum structure.

These and other objects, features, and advantages of the present invention may lie more clearly understood and appreciated from a review of the following detailed description of the disclosed embodiment and by reference to the appended drawings and claims.

BRIEF DESCRIPTION OF THE DRAWINGS

FIG. 1 is a top plan view of the phase shifting subassembly of a phased affair antenna assembly, comprising a plurality of bimetallic sandwich or clad mounting structures constructed in accordance with the present invention.

FIG. 1A is an enlarged view of the subarray 10 shown in FIG. 1.

DETAILED DESCRIPTION OF THE PREFERRED EMBODIMENT

Figure 2:
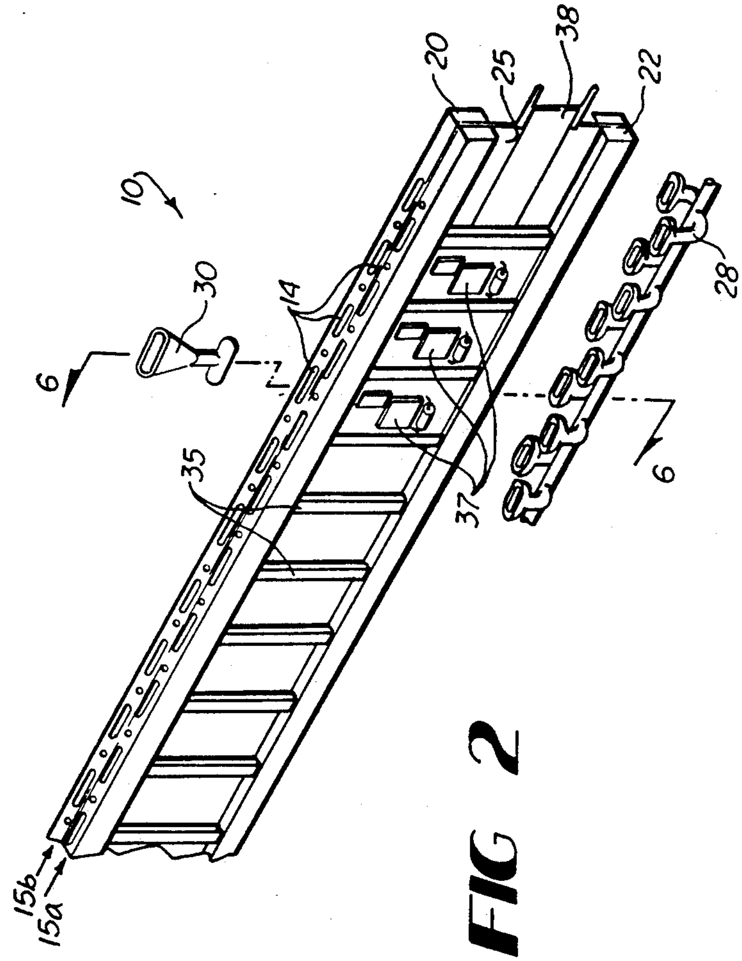
FIG. 2 is a perspective exploded view of the preferred embodiment of a single bimetallic mounting structure or subarray constructed in accordance with the present invention.

Referring now to the drawings, in which like numerals indicate like elements throughout the several views, FIG. 1 shows a top plan view of a typical phase shifting assembly 8 of a phased array antenna. The phase shifting assembly 8 comprises a plurality of elongate linear subarrays 10*a*, 10*b*, 10*c*, . . . arranged to form a planar array. Each of the linear subarrays 10 is an elongate composite laminate phase shifter mounting structure including a plurality of mounting holes 12 and a plurality of waveguide openings 14, with the mounting holes alternating with the waveguide openings, arranged in two parallel rows 15*a*, 15*b*, such as shown in FIG. 1A separated by an intermediate code 25. A plurality of the subarrays 10 are placed side varying lengths, so as to form the assembly 8.

Although a top plan view of the assembly 8 is shown in FIG. 1, the bottom plan view is identical. It should be noted that FIG. 1 is shown without any radiating structures which are affixed to the top surface when the antenna is completely assembled, and without the waveguide feed network which is affixed to the bottom. The waveguide openings 14 direct RF energy into the phase shifting assembly 8 from a waveguide feed network 28 (FIG. 2), or direct phase-shifted RF energy out of the assembly into radiating structures 30 (FIG. 2), depending upon whether one is looking at the top or at the bottom.

Figure 4:
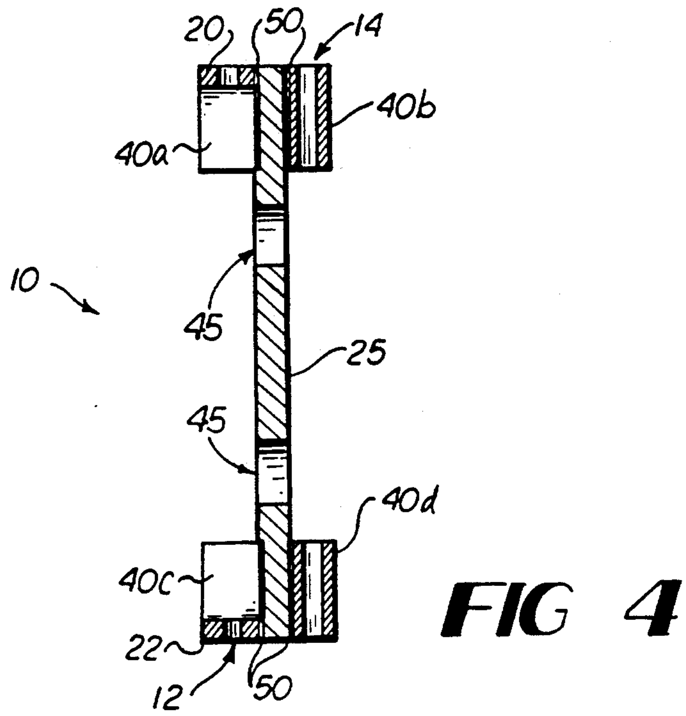
FIG. 4 is an end view of the preferred bimetallic mounting structure of FIG. 2.

Referring to FIG. 2, it will be seen that the preferred embodiment of a subarray 10 constructed in accordance with the present invention comprises a top mounting flange 20 and a bottom mounting flange 22, which are spaced apart by a relatively thin intermediate web 25 extending therebetween, with the flanges 20, 22 being widened relative to the thickness of the web 25, so that the overall subarray has the appearance of an I-beam as seen in FIG. 4. As will be understood by those skilled in the art, the Ranges 20, 22 form input and output microwave transitions. The top flange 20 includes the two rows 15*a*, 15*b* of waveguide openings 14 and mounting holes 12, while the bottom flange 22 has two similar rows (not visible in FIG. 2). A top plan view of a preferred mounting structure or subarray 10 is provided in FIG. 7.

A waveguide feed network 28, which does not form a part of the present invention, is typically mounted to the bottom flange 22 with screws or the like, which are received in the mounting holes 12. Similarly, a plurality of radiating elements or structures 30, such as horns, again not forming part of the present invention, are mounted with screws to the holes 12 in the top edge 20 of the subarray 10. Typically, the waveguide feed network are aluminum or copper, as are the radiating structures.

It should be understood that the mounting Ranges 20, 22 comprise material for machining and/or forming a microwave transition such de to dielectrically loaded waveguide, waveguide to coaxial line waveguide to microstrip, stripline to microstrip, or others, depending upon the type of phase shifter or module and the type of radiating element.

Mounted to the intermediate web 25 are a plurality of phase shifters 35 which alternate with a plurality of driver circuits 37. One type of phase shifter 35 with which the present invention is operative is ferrite-based and is constructed in accordance with U.S. Pat. No. 5,129,099 entitled RECIPROCAL HYBRID MODE CIRCUIT FOR COUPLING RF TRANSCEIVER TO AN RF RADIATOR, owned by the same assignee as the present invention. It is this type of phase shifter with which the present invention is especially useful, since the bimetallic sandwich nature of the subarray 10 keeps the waveguide openings 14 in the subarray in contact and alignment with the waveguide inputs or outputs of the phase shifters 35.

The disclosure of the referenced co-pending application is incorporated herein by reference and made a part hereof, so further discussion of the same will not be provided herein.

While the phase shifters in the referenced co-pending application have a waveguide type interface, it will be understood that the present invention is also operative with other types of phase shifters or phase control modules. The phase shifters can be active or passive, or can have a microstrip-type input/output interface, for example, the phase shifters as shown in U.S. Pat. No. 5,075,648, entitled HYBRID MODE RF PHASE SHIFTER, which is also owned by the same assignee as the present invention. The hybrid mode RF phase shifters comprise miniaturized planar waveguide phase shifters inserted serially between interrupted matched-impedance" microstrip transmission lines. The waveguide portion is butted between terminated ends of a microstrip substrate so that the thickness of the entire phase shifter device is approximately that of the central waveguide portion. The disclosure of the referenced co-pending application is incorporated herein by reference and made a part hereof, so further discussion of the same will not be provided herein.

When the phase shifters 35 are mounted to the web 25, the substrates of the phase shifters are in contact with the web. The waveguide inputs and waveguide outputs of the phase shifters (if this type of phase shifter is employed) must be placed in contact and alignment with the corresponding waveguide openings 14 on the mounting structure 10 for proper operation and minimized insertion loss. The structure of the phase shifters are typically ferrite, which gives rise to the thermal mismatch difficulties when such phase shifters are mounted to conventional all-aluminum subarray structures. Use of such conventional aluminum mounting structures forms high stresses at the junctures between the waveguide inputs/outputs of the phase shifters and the waveguide openings in the mounting structure during thermal cycling.

While the present invention is especially suitable for ferrite-based phase shifters, it should be understood that the invention is also suitable for use with monolithic microwave integrated circuit (MMIC) type phase shifters which are becoming increasingly popular. Such MMIC type phase shifters typically have ceramic substrates, whose thermal expansion coefficients are very close to that of titanium.

The driver circuits 37 are hybrid microelectronic circuits, typically constructed on ceramic substrates.

The driver circuits are affixed to a flexible strip cable 38, which extends the length of the subarray 10, lying adjacent the intermediate web 25, but underlying the phase shifters 35 and driver circuits 37. The flexible strip cable 38 is electrically connected to the driver circuits 37 for providing control signals to the driver circuits to effect a desired phase shift. These control signals are typically digital and originate from a source external to the assembly 8 of FIG. 1. The driver circuits 37 transform the digital control signal into an analog control signal corresponding to a commanded degree of phase shift for the phase shifters. Each of the driver circuits 37 is in turn electrically connected via wires (not shown) to its associated phase shifter 35 located on the opposite side of the web 25.

Since the flexible strip cable 38 and driver circuits 37 do not depend upon a rigid mounting to the subarray 10, compensation for thermal expansion is not as much of a problem as it is for the phase shifters. However, since the phase shifters 35 include integral waveguides extending between the top flange 20 and the bottom flange 22 and must provide a snug fit between the flanges when mounted to the subarray, the thermal expansion characteristics of the phase shifters 35, and especially of the substrates thereof, must be critically matched to the thermal expansion characteristic of the subarray as a whole, lest high stresses occur at the junctures between the phase shifters 35 and the waveguide openings 14 in the flanges 20, 22.

Figure 7:
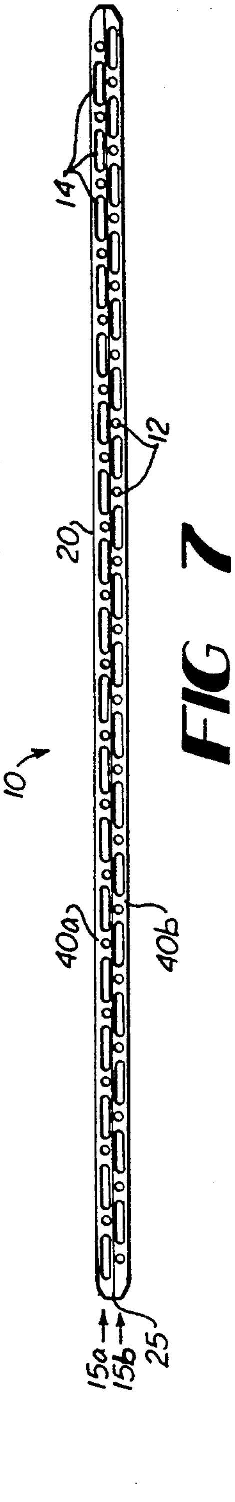
FIG. 7 is a top plan view of the preferred bimetallic mounting structure shown in FIG. 2.
Figure 3:
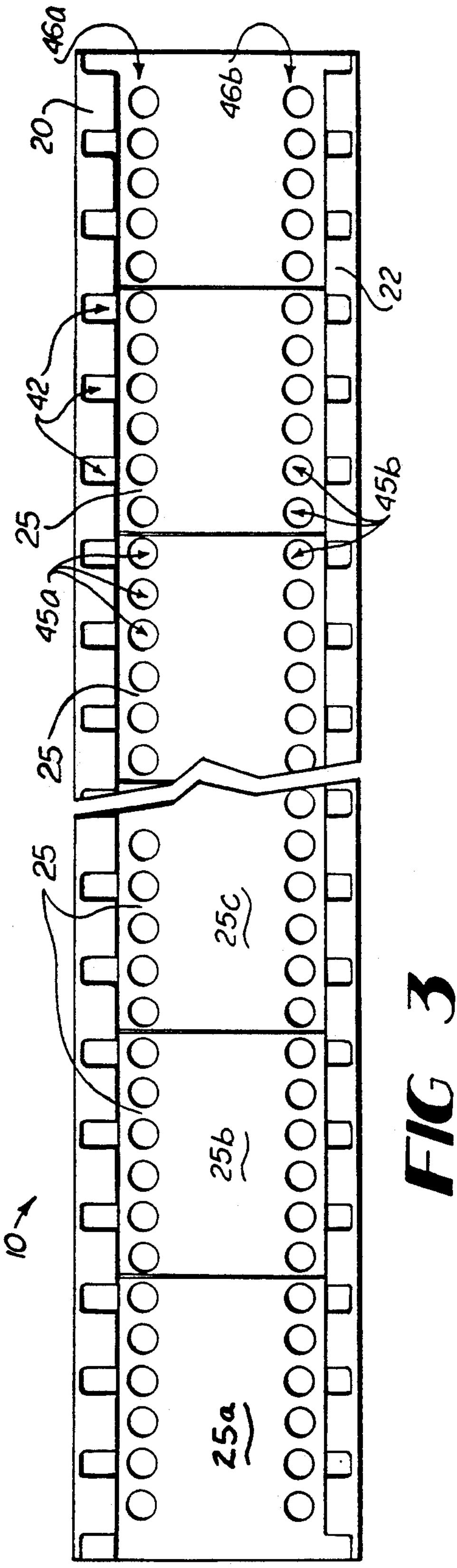
FIG. 3 is a side plan view of the preferred bimetallic mounting structure shown in FIG. 2.

Referring now to FIG. 3, it will be seen that the subarray 10 comprises an aluminum top flange 20 and aluminum bottom flange 22 spaced apart by the web 25. As best seen in FIG. 7, the top flange 20 comprises a pair of parallel aluminum bars or strips 40*a*, 40*b*, separated by the thickness of the web 25 (not shown herein). A row of U-shaped cutouts 42 is provided so as to remove aluminum and effect weight savings, as well as provide space for mounting screws.

The bottom flange 22 is of construction similar to the top flange 20.

The preferred intermediate web 25 comprises a plurality of approximately rectangular titanium intermediate web portions 25*a*, 25*b*, 25*c*, etc., which extend the length of the subarray 10. The intermediate web portions 25*a*, 25*b*, 25*c*, etc., about one another with a slight expansion gap on the order of about 0.040 inches so as to provide expansion room for the edges of the web portions 25*a*, 25*b*, 25*c* which extend across the width of the subarray 10.

The center web 25 further includes a plurality of aligned magnet-receiving holes 45*a*, 45*b*, arranged in two parallel rows 46*a*, 46*b* along the length of the subarray 10, opposing each other, and juxtaposed with the flanges 20, 22. The magnet-receiving holes 45 are positioned to receive magnet covers of the hybrid mode RF phase shifter devices 35 constructed in accordance with the referenced co-pending application.

It will be understood that there are electrical connections (not shown) between each driver circuit 37 and its associated phase shifter 35. In the preferred embodiment, a driver circuit is on opposite side of the web 25 from its associated phase shifter. However, it should be understood that a driver circuit could be adjacent to its respective phase shifter on the same side of the web 25.

Figure 5:
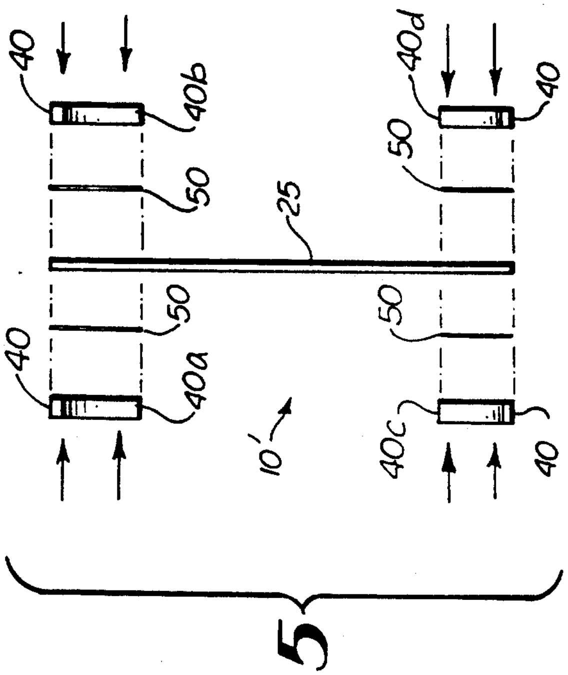
FIG. 5 is a schematic exploded end view of the preferred sandwich stock material design for the bimetallic mounting structure of FIG. 2, showing the layers of the bimetal material.

Turning next to FIGS. 4 and 5, it will be seen that the preferred subarray 10 is a bimetallic sandwich or clad structure comprising alternating rows of different materials in a "sandwich"-like laminated structure. While the preferred embodiment comprises an aluminum/titanium/aluminum composite, it will be understood that other materials such as plastics are also contemplated. The preferred method of fabricating the bimetallic sandwich or clad subarray includes the step of creating the laminated structure prior to machining the top and bottom flanges 20, 22, to form the mounting holes 12 and the waveguide openings 14 and drilling holes 45 in the web 25. The assembled and machined subarray 10 in FIG. 4 comprises a pair of top aluminum bars 40*a*, 40*b* and a pair of bottom aluminum bars 40*c*, 40*d*, which are affixed to the intermediate web 25 with layers of adhesive 50. When the entire bimetallic sandwich or clad structure is completed, then the cutouts, mounting holes, waveguides, and other openings are machined into the upper flange 20 or bottom flange 22.

Figure 6:
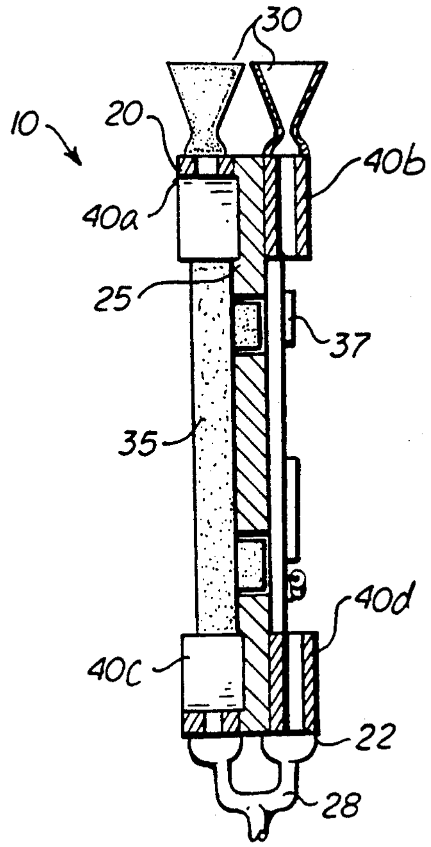
FIG. 6 is a sectional view taken along the line 6—6 of FIG. 2, showing the assembled radiating structures and waveguide feed network.

As shown in FIG. 5, prior to machining, the I-beam or subarray 10' is fabricated by a method of forming alternating layers of aluminum bars 40, adhesive 50, and titanium of the intermediate web 25. The preferred material for the intermediate web 25 is titanium, whose thermal expansion characteristics will of course match the thermal expansion coefficient of the substrates of the phase shifters 35. As seen in FIG. 6, the phase shifters 35 are physically mounted to the intermediate web 25, positioned between upper flange 20 and lower flange 22 of the subarray 10.

It will also be seen in FIG. 6 that the top aluminum bars 40*a*, 40*b* and the bottom aluminum bars 40*c*, 40*d*, are held in spaced-apart relation by the web 25, that the radiating elements or structures 30 are mounted to the top aluminum bars 40*a*, 40*b*, that the waveguide feed network 28 is mounted to the bottom aluminum bars 40*c*, 40*d*, and that the driver circuits 37 are mounted on one side of the web 25 extending between the top aluminum bar 40*b* and the bottom aluminum bar 40*d*.

The preferred adhesive 50 is a type NB-102 epoxy adhesive made by Ablestik Laboratories, Gardena, Calif., formed in layers or strips of 5 to 15 mils. Characteristics of the preferred adhesive 50 include a high shear strength, a high temperature operating range, and a high percent elongation. The process of lamination is not believed to be critical as long as the number of center webs 25 is sufficient. Using a 5 mil bond line, with 4 inch center webs 25 spaced 0.040 inches apart, many flexible thermally set adhesives will be satisfactory. Other suitable adhesives are manufactured by various manufacturers including Minnesota Mining & Manufacturing Co. (3-M), American Cyanamid, and others, and will be known to those skilled in the art. Also, it is preferred that a film type adhesive be used for ease of application, uniformity of thickness, and uniformity of coverage of the web 25 and the aluminum bars 40.

After application of a layer of adhesive 50 to either the web or the aluminum rails, the aluminum bars 40 are then positioned on the web 25 to form the top flange 20 and bottom flange 22, and placed in a heat press at a temperature of between about 100° C. and about 150° C., and preferably at about 120° C., with a pressure of between about 25 pounds per square inch and about 100 pounds per square inch, and preferably at about 50 pounds per square inch, across the entire length of the subarray for at least 90 minutes. The bimetallic sandwich or clad subarray 10 is removed from the heat press and allowed to cool. The subarray may then be handled as a unitary structure and machined in the conventional manner to form the cutouts, mounting holes, etc., without undue risk of delamination.

It should also be understood that the means for bonding the flanges 20, 22 to the web 25 can also comprise brazing the metals together in the known manner, as well as intermolecular attachment. For intermolecular attachment, those skilled in the art will understand that explosive bonding methods may be employed to force the outer, contacting layers of atoms in the metal of the aluminum in the bars and the titanium in the web to "join" or fuse and hold the metals together. It will thus be understood that adhesive bonding, brazing, and intermolecular attachment by explosive bonding are considered equivalent bonding means and methods.

It will now be appreciated that the final result of the fabrication method is a one piece unitary subarray 10 with aluminum as a mounting surface on the top flange and bottom flange for low cost and ease of machinability, and titanium as the intermediate web for thermal expansion matching with the phase shifters 35. It will also be appreciated that the aluminum of the flanges 20, 22 is thermally matched to the radiating structures and waveguide feed network with the use of the present invention, while maintaining thermal match with the substrates of the phase shifters.

The preferred embodiment of the present invention has been disclosed by way of example and it will be understood that other modifications may occur to those skilled in the art without departing from the scope and the spirit of the appended claims.

What is claimed is:

1. In a phased array antenna comprising a plurality of radiating structures, a plurality of phase shifter circuits connected to said plurality of radiating structures, and a signal feed network operatively connected to provide a signal to said plurality of phase shifter circuits, an improved antenna structure, comprising:

- a composite laminate structure comprising oppositely disposed outer flanges and a center web connected to said outer flanges for mounting said phase shifter circuits;
- said center web having a coefficient of thermal expansion which is substantially matched to a coefficient of thermal expansion associated with said phase shifter circuits;
- said plurality of radiating structures being supported on one of said outer flanges and said signal feed network being supported on the other one of said outer flanges; and
- said outer flanges being of a material having a coefficient of thermal expansion which is substantially matched to a corresponding coefficient of thermal expansion associated with said radiating structures and signal feed network.

2. The improved antenna structure of claim 1, wherein said composite laminate structure comprises a bimetal.

3. The improved antenna structure of claim 1, wherein said outer flanges consists of aluminum and said center web consists of titanium.

4. The improved antenna structure of claim 1, wherein said outer flanges comprise alternating layers of aluminum, adhesive, and titanium.

5. The improved antenna structure of claim 1, wherein said composite laminate structure has a general "I" shape, with said outer flanges corresponding to oppositely disposed ends of the "I" and said center web corresponding to a region in between said oppositely disposed ends.

6. The improved antenna structure of claim 1, wherein said composite laminate structure is an elongate structure having a length, a width, and a thickness, wherein said center web extends across the width of said composite laminate structure, and wherein said center web comprises a plurality of adjacent center web portions extending along the length of said elongate composite laminate structure.

7. The improved antenna structure of claim 6, wherein said plurality of adjacent center web portions are spaced apart a predetermined distance to allow for thermal expansion in the direction of said length of said composite laminate structure.

8. The improved antenna structure of claim 1, wherein said radiating structures include waveguides connected to one of said outer flanges as inputs and said signal feed network includes waveguides connected to said other one of said outer flanges as outputs, wherein said phase shifters include waveguide type inputs and outputs, and wherein said phase shifters are mounted to said structure with said phase shifter waveguide inputs and outputs in contact and alignment with said waveguides on said radiating structure and signal feed network.

9. In a phase antenna comprising a plurality of radiating structures, a plurality of phase shifter circuits connected to said plurality of radiating structures, and a waveguide feed network operatively connected to provide an input signal to said plurality of phase shifter circuits, said phase shifter circuits being operative to shift said input signal by predetermined amount corresponding to a desired phase shift for an associated one of said radiating structures, said phase shifter circuits being affixed to a substrate, said substrate having a first predetermined coefficient of thermal expansion, an improved phase shifter mounting structure for supporting said radiating structures, said phase shifter circuits, and said feed network, comprising:

- a top flange;
- means for supporting a plurality of radiating structures on said top flange;
- a bottom flange;
- means for supporting a waveguide feed network on said bottom flange;
- a center web extending between said top flange and said bottom flange;
- means associated with said center web for supporting a plurality of said phase shifter circuits;
- said center web having a predetermined coefficient of thermal expansion which is substantially the same as said first predetermined coefficient of thermal expansion; and
- said top flange, said bottom flange, and said center web are configured so as to comprise a unitary laminated structure;
- whereby said center web and said phase shifter substrates experience similar degrees of expansion and contraction under thermal cycling.

10. The improved supporting structure of claim 9, wherein said center web consists of titanium, and wherein said top flange comprises alternating layers of aluminum, adhesive, and titanium.

11. The improved supporting structure of claim 9, wherein said structure is an elongate structure having a length, and wherein said center web comprises a plurality of separate center web portions extending along said length of said elongate structure.

12. The improved supporting structure of claim 11, wherein said plurality of center web portions are spaced apart a predetermined distance to allow for thermal expansion in the direction of said length of said elongate structure.

13. The improved supporting structure of claim 11, wherein said top flange comprises a pair of aluminum bars extending along said length of said elongate structure and said bottom flange comprises a second pair of aluminum bars extending along the length of said elongate structure.

14. The improved supporting structure of claim 13, wherein said pair of aluminum bars of said top flange are separated by a thickness of said center web and affixed thereto in a laminated structure, and said pair of aluminum bars of said bottom flange are separated by said thickness of said center web and affixed thereto in a laminated structure.

15. An improved phased array antenna structure, comprising:

a plurality of phase shifter circuits;

a center web for supporting said phase shifter circuits, said center web having a coefficient of thermal expansion which is substantially matched to a coefficient of thermal expansion associated with said phase shifter circuits;

a radiating structure operatively affixed to said center web and operatively associated with said phase shifter circuits; and a signal feed network operatively affixed to said center web and operatively associated with said phase shifter circuits.

16. The improved phase array antenna structure of claim 15, wherein said radiating structure comprises an outer flange affixed to said center web, and an antenna horn mounted to said outer flange.

17. The improved phase array antenna structure of claim 15, wherein said radiating structure and said signal feed network consist of aluminum and said center web consists of titanium.

18. The improved phase array antenna structure of claim 15, wherein said radiating structure and said signal feed network are affixed to said center web.

19. The improved phase array antenna structure of claim 15, wherein said center web comprises a plurality of separate adjacent center web portions.

20. The improved phase array antenna structure of claim 19, wherein said plurality of adjacent center web portions are spaced apart a predetermined distance to allow for thermal expansion.

21. The improved phased array antenna structure of claim 15, wherein said phase shifters include waveguide type inputs and outputs, and wherein said phase shifters are mounted to said center web with said waveguide inputs in operative alignment with corresponding waveguides in said signal feed network and said waveguide outputs in operative alignment with corresponding waveguides in said radiating structure, respectively.

22. The improved phased array antenna structure of claim 15, wherein said signal feed network comprises at least one inner flange affixed to said center web, and a waveguide network mounted to said inner flange.

23. An improved supporting structure for supporting an energy input means and an energy output means in an electronic subassembly, comprising:

at least one composite billet comprising oppositely disposed outer flanges and a center web connected to said outer flanges;

said oppositely disposed outer flanges being of a material having a coefficient of thermal expansion which is substantially matched to a corresponding coefficient of thermal expansion associated with said energy input means and said energy output means;

said center web being of a material having a coefficient of thermal expansion which is substantially matched to a corresponding coefficient of thermal expansion associated with the electronic components mounted to said web.

24. The improved supporting structure of claim 23, wherein said oppositely disposed outer flanges consist of aluminum, and said web consists of titanium.

25. The improved supporting structure of claim 23, wherein said energy input means comprises a waveguide feed network and said energy output means comprises antenna radiating structures.

26. The improved supporting structure of claim 23, wherein said electronic components supporting on said web comprise phase shifters having ceramic substrates.

27. The improved supporting structure of claim 26, wherein said phase shifters include a waveguide type input and a waveguide type output, and wherein said phase shifters are mounted to said center web with said waveguide input and said waveguide output in operative alignment with corresponding waveguides associated with said energy input means and said energy output means, respectively.

28. The improved supporting structure of claim 23, wherein said radiating structure is an antenna in a phased array antenna.

29. The improved supporting structure of claim 28, wherein said outer flanges are affixed to said center web with adhesive.

30. The improved supporting structure of claim 28, wherein said center web comprises a plurality of separate adjacent center web portions.

31. The improved supporting structure of claim 30, wherein said plurality of adjacent center web portions are spaced apart a predetermined distance to allow for thermal expansion.

32. The improved supporting structure of claim 23, wherein said radiating structure is operatively affixed to one of said outer flanges.

33. The improved supporting structure of claim 32, wherein said one of said outer flanges is affixed to said center web, and wherein said radiating structure is affixed to said one of said outer flanges.

34. The improved supporting structure of claim 23, wherein said at least one composite billet comprises a plurality of composite billets assembled into a planar array of a phased array antenna.

35. The improved supporting structure of claim 23, wherein said energy output means comprises a radiating structure.

36. The improved supporting structure of claim 23, wherein said energy input means comprises a signal feed network.

37. The improved supporting structure of claim 36, wherein said signal feed network is operatively affixed to one of said outer flanges.

38. The improved supporting structure of claim 37, wherein said one of said outer flanges is affixed to said center web, and wherein said microwave signal feed network is affixed to said one of said outer flanges.

39. The improved supporting structure of claim 23, wherein said composite billet comprises a bimetallic material comprising alternating layers of aluminum, adhesive, and titanium.

40. In a phased array antenna comprising a plurality of radiating structures, a plurality of phase shifter circuits connected to said plurality of radiating structures, and a signal feed network operatively connected to provide a signal to said plurality of phase shifter circuits, an improved low cost, light weight, high performance phase shifter supporting structure for supporting said radiating structures, said phase shifter circuits, and said signal feed network, comprising:

a subarray structure for supporting said phase shifter circuits, said radiating structures, and said signal feed network comprising symmetric outer layers and a center core layer;

said core layer having a coefficient of thermal expansion which matches a coefficient of thermal expansion associated with said phase shifter circuits;

said outer layers comprising a soft metal for providing low loss microwave transitions from said phase shifter circuits to said radiating structures and from said phase shifter circuits to said signal feed network, respectively.

41. The improved supporting structure of claim 40, wherein said outer layers consists of aluminum and said center web consists of titanium.

42. The improved supporting structure of claim 40, wherein said outer layers are continuous structures.

43. The improved supporting structure of claim 40, wherein said outer layers comprise four separate bars, a first pair of said bars defining a first one of said outer layers and second pair of said bars defining a second, oppositely disposed one of said outer layers.

44. An improved supporting structure for an electrical device carried on a ceramic substrate, said electrical device being operative to receive a signal and process said signal to provide a processed signal, comprising:

a center web for supporting at least one ceramic substrate carrying said electrical device, said center web having a coefficient of thermal expansion which is substantially matched to a coefficient of thermal expansion associated with said ceramic substrate;

a first flange operatively affixed to a first periphery of said center web and having a first coefficient of thermal expansion different from said coefficient of thermal expansion of said center web, for supporting a signal feed device that directs said signal to said electrical device; and a second flange operatively affixed to a second periphery of said center web and having a second coefficient of thermal expansion different from said coefficient of thermal expansion of said center web, for supporting a signal transmission device that receives said processed signal from said electrical device.

45. The improved supporting structure of claim 44, wherein said electrical device is a phase shifter mounted to a ceramic substrate.

46. The improved supporting structure of claim 45, wherein said phase shifter includes a waveguide type input and a waveguide type output, and wherein said phase shifter is mounted to said center web with said waveguide input and said waveguide output in operative alignment with corresponding waveguides associated with said signal feed device and said signal transmission device, respectively.

47. The improved supporting structure of claim 44, wherein said signal feed device is a microwave signal feed network.

48. The improved supporting structure of claim 47, wherein said microwave signal feed network is operatively affixed to said first flange.

49. The improved supporting structure of claim 48, wherein said first flange is affixed to said center web, and wherein said microwave signal feed network is affixed to said first flange.

50. The improved supporting structure of claim 44, wherein said signal transmission device is a radiating structure.

51. The improved supporting structure of claim 50, wherein said radiating structure is an antenna in a phase array antenna.

52. The improved supporting structure of claim 50, wherein said radiating structure is operatively affixed to said second flange.

53. The improved supporting structure of claim 52, wherein said second flange is affixed to said center web, and wherein said radiating structure is affixed to said second flange.

54. The improved supporting structure of claim 44, wherein said first flange and said second flange consist of aluminum and said center web consists of titanium.

55. The improved supporting structure of claim 44, wherein said first flange and said second flange are affixed to said center web.

56. The improved supporting structure of claim 44, wherein said center web comprises a plurality of separate adjacent center web portions.

57. The improved supporting structure of claim 56, wherein said plurality of adjacent center web portions are spaced apart a predetermined distance to allow for thermal expansion.

58. The improved supporting structure of claim 44, wherein said first coefficient of thermal expansion is the same as said second coefficient of thermal expansion.

59. In a phased array antenna comprising a plurality of radiating structures, a plurality of phase shifter circuits connected to said plurality of radiating structures and comprising a plurality of phase control modules affixed to a substrate, said substrate having a first predetermined coefficient of thermal expansion, and a waveguide feed network operatively connected to provide a signal to said plurality of phase shifter circuits, an improved antenna supporting subarray structure for supporting said radiating structures, and phase shifter circuits, and said feed network, comprising:

an elongate top flange having a length comprising a pair of aluminum bars extending along said length of said subarray;

means for supporting a plurality of radiating structures on said top flange in a pair of parallel rows;

means in each of said aluminum bars f said top flange defining a plurality of waveguides for directing electromagnetic energy from respective ones of said phase sifter circuits to corresponding ones of said radiating structures on said top flange;

a bottom flange comprising a second pair of aluminum bars extending along the length of said subarray;

means for supporting said waveguide feed network on said bottom flange;

means in each of said aluminum bars of said bottom flange defining a plurality of waveguides for directing electromagnetic energy from said waveguide feed network on said bottom flange to corresponding ones of said phase shifter circuits;

a titanium center web extending between said top flange and said bottom flange;

means associated with said center web for supporting said plurality of phase control modules;

said center web having a predetermined coefficient of thermal expansion substantially the same as said first predetermined coefficient of thermal expansion;

said pair of aluminum bars of said top flange being separated by said center web and affixed thereto in a laminated structure; and said pair of aluminum bars of said bottom flange being separated by said center web and affixed thereto in a laminated structure, whereby said center web and said phase shifter substrates experience similar degrees of expansion and contraction under thermal cycling.

* * * * *